(12) United States Patent
Harkins et al.

(10) Patent No.: US 12,189,004 B2
(45) Date of Patent: Jan. 7, 2025

(54) EFFICIENT GRADIENT WAVEFORM MEASUREMENTS WITH VARIABLE PREPHASING

(71) Applicant: Vanderbilt University, Nashville, TN (US)

(72) Inventors: Kevin Harkins, Nashville, TN (US); Mark D. Does, Nashville, TN (US)

(73) Assignee: Vanderbilt University, Nashville, TN (US)

( * ) Notice: Subject to any disclaimer, the term of this patent is extended or adjusted under 35 U.S.C. 154(b) by 217 days.

(21) Appl. No.: 18/164,362

(22) Filed: Feb. 3, 2023

(65) Prior Publication Data

US 2023/0251340 A1    Aug. 10, 2023

Related U.S. Application Data

(60) Provisional application No. 63/306,900, filed on Feb. 4, 2022.

(51) Int. Cl.
  *G01R 33/24*     (2006.01)
  *G01R 33/565*    (2006.01)
(52) U.S. Cl.
  CPC ..... *G01R 33/243* (2013.01); *G01R 33/56518* (2013.01); *G01R 33/56572* (2013.01)
(58) Field of Classification Search
  CPC ............ G01R 33/243; G01R 33/56518; G01R 33/56572
  See application file for complete search history.

(56) References Cited

U.S. PATENT DOCUMENTS

| | | | | |
|---|---|---|---|---|
| 5,905,377 | A * | 5/1999 | Kerr ..................... | G01R 33/389 324/309 |
| 7,323,872 | B1 * | 1/2008 | Takahashi .............. | G01R 33/58 324/309 |
| 2013/0307542 | A1 | 11/2013 | Chen | |
| 2016/0033605 | A1 | 2/2016 | Stemmer et al. | |

(Continued)

OTHER PUBLICATIONS

K.D. Harkins et al. Journal of Magnetic Resonance 327 (2021) 106945 https://doi.org/10.1016/j.jmr.2021.106945 (Year: 2021).*

(Continued)

*Primary Examiner* — Steven L Yeninas
(74) *Attorney, Agent, or Firm* — Blank Rome LLP

(57) ABSTRACT

Accurate measurement of gradient waveform errors can often improve image quality in sequences with time varying readout and excitation waveforms. Self-encoding or offset-slice method sequences are commonly used to measure gradient waveforms. However, the self-encoding method requires a long scan time, while the offset-slice method is often low precision, requiring the thickness of the excited slice to be small compared to the maximal k-space encoded by the test waveform. This disclosure describes a novel hybrid of those methods, referred to as variable-prephasing (VP). Like the offset-slice method, VP uses the change in signal phase from offset-slices to calculate the gradient waveform. Similar to the self-encoding method, repeated acquisitions with a variable amplitude self-encoding gradient mitigates the signal loss due to phase wrapping, which, in-turn, allows thicker slices and greater SNR.

18 Claims, 9 Drawing Sheets

(56) References Cited

U.S. PATENT DOCUMENTS

2021/0341558 A1\* 11/2021 Paul ................. G01R 33/56554
2022/0026512 A1\* 1/2022 Kettinger ........... G01R 33/5611

OTHER PUBLICATIONS

Hao Tan et al., "Estimation of k-Space Trajectories in Spiral MRI", Magnetic Resonance in Medicine 61:1396-1404 (2009).
Ryan K. Robinson et al., "Fast, Simple Gradient Delay Estimation for Spiral MRI", Magnetic Resonance in Medicine 63:1683-1690 (2010).
Amir Moussavi et al., "Correction of Gradient-Induced Phase Errors in Radial MRI", Magnetic Resonance in Medicine 71:308-312 (2014).
David S. Smith et al., "Self-calibrated gradient delay correction for golden angle radial MRI", Proc. Intl. Soc. Mag. Reson. Med. 22 (2014), p. 1538.
M. Krämer et al., "Intrinsic correction of system delays for radial magnetic resonance imaging", Magnetic Resonance Imaging 33 (2015) 491-496.
Anagha Deshmane et al., "Self-Calibrated Trajectory Estimation and Signal Correction Method for Robust Radial Imaging Using GRAPPA Operator Gridding", Magnetic Resonance in Medicine 75:883-896 (2016).
Peter Latta et al., "K-space trajectory mapping and its application for ultrashort Echo time imaging", Magnetic Resonance Imaging 36 (2017) 68-76.
Xia Zhao et al., "Impact of gradient imperfections on bone water quantification with UTE MRI", Magentic Resonance in Medicine 84:2034-2047 (2020).
Sonal Josan et al., "Double Half RF Pulses for Reduced Sensitivity to Eddy Currents in UTE Imaging", Magnetic Resonance in Medicine 61:1083-1089 (2009).
Sonal Josan et al., "Improved Half RF Slice Selectivity in the Presence of Eddy Currents with Out-of-Slice Saturation", Magnetic Resonance in Medicine 61:1090-1095 (2009).
Kevin D. Harkins et al., "Iterative Method for Predistortion of MRI Gradient Waveforms", IEEE Transactions on Medical Imaging, vol. 33, No. 8, Aug. 2014.
Hilary T. Fabich et al., "Ultrashort echo time (UTE) imaging using gradient pre-equalization and compressed sensing", Journal of Magnetic Resonance 245 (2014) 116-124.
Mary Kate Manhard et al., "30-Second Bound and Pore Water Concentration Mapping of Cortical Bone Using 2D UTE With Optimized Half-Pulses", Magnetic Resonance in Medicine 77:945-950 (2017).
W.A. Grissom et al., "GrIP: Gradient Iterative Predistortion for Multidimensional and Parallel Excitation", Proc. Intl. Soc. Mag. Reson. Med. 18 (2010), p. 4925.
Mustafa Cavusoğlu et al., "VERSE-guided parallel RF excitations using dynamic field correction", NMR in Biomedicine, 2017;30:e3697; http://doi.org/10.1002/nbm.3697.
Samy Abo Seada et al., "Multiband RF pulse design for realistic gradient performance", Magnetic Resonance in Medicine 81:362-376 (2019).
Christoph S. Aigner et al., "Time optimal control-based RF pulse design under gradient imperfections", Magnetic Resonance in Medicine 83:561-574 (2020).
Christoph Barmet et al., "Spatiotemporal Magnetic Field Monitoring for MR", Magnetic Resonance in Medicine 60:187-197 (2008).
Nicola De Zanche et al., "NMR Probes for Measuring Magnetic Fields and Field Dynamics in MR Systems", Magnetic Resonance in Medicine 60:176-186 (2008).
T. Onodera et al., "A method of measuring field-gradient modulation shapes. Application to high-speed NMR spectroscopic imaging", J. Phys. E: Sci. Instrum. 20 (1987).
Atsushi Takahashi et al., "Compensation of Multi-Dimensaitonal Selective Excitation Pulses Using Measured k-Space Trajectories", 1995, https://onlinelibrary.wiley.com/doi/10.1002/mrm1910340323, pp. 446-456.
Nikolaos G. Papadakis et al., "A General Method for Measurement of the Time Integral of Variant Magnetic Field Gradients: Application To 2D Spiral Imaging", Magnetic Resonance Imaging, vol. 15, pp. 567-578, 1997.
Marcus T. Alley et al., "Gradient Characterization Using a Fourier-Transform Technique", https://onlinelibrary.wiley.com/doi/10.1002/mrm.1910390411, 1998.
Shaihan J. Malik et al., "Tailored Excitation in 3D with Spiral Nonselective (SPINS) RF Pulses", Magnetic Resonance in Medicine 67:1303-1315 (2012).
Jeff H. Duyn et al., "Communications—Simple Correction Method for k-Space Trajectory Deviations in MRI", Journal of Magnetic Resonance 132, 150-153 (1998), Article No. MN981396.
Yantian Zhang et al., "A Novel k-Space Trajectory Measurement Technique", 1998, https://onlinelibrary.wiley.com/doi/10.1002/mrm1910390618.
P. Gurney et al., "A Simple Method for Measuring B0 Eddy Currents", Proc. Intl Soc. Mag. Reson. Med. 13 (2005).
Ethan K. Brodsky et al., "Characterizing and Correcting Gradient Errors in Non-Cartesian Imaging: Are Gradient Errors Linear Time-Invariant (LTI)?", Magnetic Resonance in Medicine 62:1466-1476 (2009).
Hákon Gudbjartsson et al., "The Rician Distribution of Noisy MRI Data", 1995, https://onlinelibrary.wiley.com/doi/10.1002/mrm.1910340618.
Nii Okai Addy et al., "Simple Method for MR Gradient System Characterization and k-Space Trajectory Estimation", Magnetic Resonance in Medicine 68:120-129 (2012).
Signe J. Vannesjo et al., "Gradient System Characterization by Impulse Response Measurements with a Dynamic Field Camera", Magnetic Resonance in Medicine 69:583-593 (2013).
S. Johanna Vannesjo et al., "Field Camera Measurements of Gradient and Shim Impulse Responses Using Frequency Sweeps", Magnetic Resonance in Medicine 72:570-583 (2014).
Frédéric G. Goora et al., "Arbitrary magnetic field gradient waveform correction using an impulse response based pre-equalization technique", Journal of Magnetic Resonance 238 (2014) 70-76.
Manuel Stich et al., "Gradient waveform pre-emphasis based on the gradient system transfer function", Magnetic Resonance in Medicine 80:1521-1532 (2018).
Jürgen Rahmer et al., "Rapid acquisition of the 3D MRI gradient impulse response function using a simple phantom measurement", Magnetic Resonance in Medicine 82:2146-2159 (2019).

\* cited by examiner

EFFICIENT GRADIENT WAVEFORM MEASUREMENTS WITH VARIABLE PREPHASING

CROSS REFERENCE TO RELATED APPLICATIONS

This application claims priority to U.S. provisional patent application No. 63/306,900, filed on Feb. 4, 2022, which is hereby incorporated herein by reference in its entirety.

GOVERNMENT SPONSORSHIP

This invention was made with government support under Grant Nos. R01EB019980 and R01EB014308 awarded by NIH. The government has certain rights in the invention.

BACKGROUND

Gradient waveform imperfections—where the resultant magnetic gradient field differs from the intended field due to eddy currents, gradient amplifier nonlinearities, or other gradient system errors—are a common source of artifacts in magnetic resonance imaging (MRI) techniques. A common source of image artifacts in MM, specifically for advanced imaging techniques, is fidelity of the gradient system, which is used to encode image information. Gradient waveform corrections are encoded to improve the image quality in non-Cartesian imaging, such as spiral, radial, and radial center-out trajectory imaging. Waveform errors have also been known to cause slice profile distortion for 2D ultrashort echo time (UTE) imaging and, more generally, for excitation schemes with time-varying gradient trajectories. For many such acquisitions, the image quality depends upon an accurate measurement and correction of the gradient field error. Accordingly, methods to measure gradient waveforms are crucial to improve image quality in MM techniques.

Gradient waveforms may be measured using magnetic field cameras; however, such systems require additional specialized hardware and careful calibration. Therefore, it is desirable to measure gradient waveforms using standard system hardware. Currently, measuring gradient waveforms using standard system hardware falls into two categories: self-encoding methods and offset-slice methods.

Self-encoding methods use a gradient with known area between a slice-selective excitation and a test gradient applied during signal reception. The test gradient waveform is inferred from the envelope of the signal—e.g., the magnitude of the signal peaks when the time integral of the test gradient cancels that of the self-encoding gradient. The sequence is repeated with different self-encoding gradient amplitudes until the test gradient area can be calculated with sufficient temporal resolution. Because numerous repetitions are required to encode a gradient waveform, self-encoded methods are known to require long acquisition times.

Offset-slice methods estimate the gradient field based upon the phase of the acquired complex signal. The change in phase over time is proportional to both the amplitude of the applied gradient field and the distance of the offset-slice from gradient isocenter. The sequence is repeated with the test gradient on and off, so that the applied gradient waveform may be distinguished from background sequence contributions and sample-dependent phases. The sequence is also repeated at multiple slices, so that both the applied gradient and Bo eddy currents are distinguished. While offset-slice methods are considered relatively fast, offset-slice methods typically result in lower signal-to-noise ratios (SNR). Further, offset-slice methods require a thin slice to avoid phase wrapping through the slice. That is, offset-slice methods require the thickness of the excited slice to be small compared to the maximal k-space encoded by the test waveform.

SUMMARY

Embodiments disclosed herein provide a gradient waveform measurement system and method that are capable of overcoming the above-described disadvantages of self-encoding and offset-slice methods.

In one aspect, embodiments disclosed herein are related to a method for measuring gradient waveforms in an Mill device that includes generating slice-selective signal excitations and prephasing self-encoding gradients at a number of amplitudes for a slice. The prephasing self-encoding gradient is based on a change in phase from the slice-selective signal excitation. After generating the prephasing self-encoding gradient, radio frequency (RF) signal reception is measured while applying a test gradient.

In another aspect, embodiments disclosed herein are related to a system for measuring gradient waveforms that includes an Mill device and a computer. The computer includes a processor that executes a program configured to cause the Mill device to generate slice-selective signal excitations and prephasing self-encoding gradients at a number of amplitudes for a slice. The prephasing self-encoding gradient is based on a change in phase from the slice-selective signal excitation. After generating the prephasing self-encoding gradient, the processor causes the Mill device to measure radio frequency (RF) signal reception while applying a test gradient.

Advantages of embodiments disclosed herein will become more fully apparent from the detailed description of the invention hereinbelow.

BRIEF DESCRIPTION OF THE DRAWINGS

The foregoing summary, as well as the following detailed description, will be better understood when read in conjunction with the appended drawings. For the purpose of illustration only, there is shown in the drawings certain embodiments. It is understood, however, that the inventive concepts disclosed herein are not limited to the precise arrangements and instrumentalities shown in the figures. The detailed description will refer to the following drawings in which like numerals, where present, refer to like items.

DETAILED DESCRIPTION OF THE INVENTION

Figure 1:
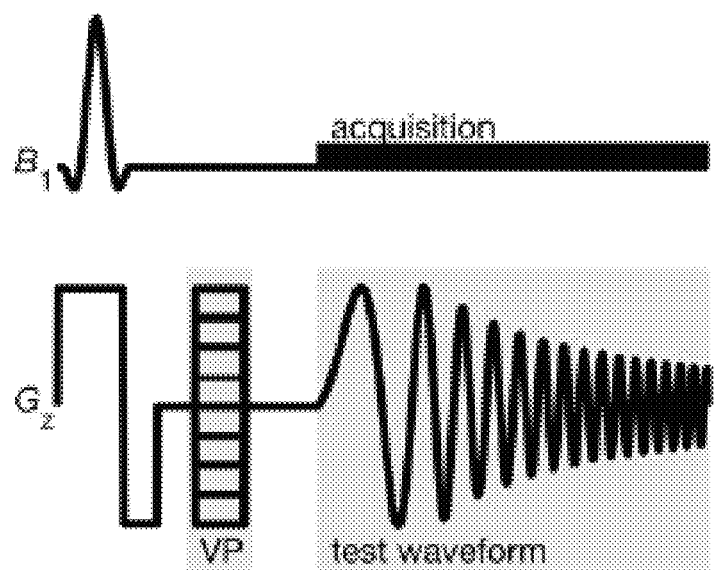
FIG. 1 illustrates a variable prephasing (VP) pulse sequence in accordance with embodiments disclosed herein.

It is to be understood that the figures and descriptions herein may have been simplified to illustrate elements that are relevant for a clear understanding of the present invention, while eliminating, for purposes of clarity, other elements found in a typical MR system, typical gradient measurement system, typical method of using an MR system, or typical method of measuring a gradient waveform. Those of ordinary skill in the art will recognize that other elements may be desirable and/or required in order to implement the present invention. However, because such elements are well known in the art, and because they do not facilitate a better understanding of the present invention, a discussion of such elements is not provided herein. It is also to be understood that the drawings included herewith only provide diagrammatic representations of the presently preferred structures and that structures falling within the scope of this application may include structures different than those shown in the drawings.

In general, embodiments disclosed herein are directed to a novel variable prephasing (VP) method and system for measuring gradient waveforms to improve MRI quality in sequences with time varying readout and excitation waveforms. Embodiments use the change in signal phase from offset-slices with repeated acquisitions using a variable amplitude self-encoding gradient to calculate the gradient waveform. The variable amplitude self-encoding gradient mitigates the signal loss due to phase wrapping, which, in-turn, allows for thicker slices and greater SNR.

More specifically, embodiments disclosed herein insert a VP gradient between the signal excitation and the readout of a test gradient waveform. The amplitude of the VP gradient is varied between repetitions of the sequence, causing the region of the encoded signal to shift within the readout of the test waveform. That allows for an increase the SNR efficiency of the gradient waveform measurements and thicker slices during imaging acquisition.

The number of variable amplitudes selected allows embodiments to be engineered to trade-off scan time for measurement precision. That is, fewer steps in amplitude results in faster scans with less precision, while a large number of steps in amplitude results in slower scans with higher precision. One of ordinary skill in the art will appreciate that the number of variable amplitude acquisitions may be selected based on the desired SNR of the gradient waveform towards improving MR image quality. For example, the scan time may be optimized to the precision necessary for the information sought from an MR imaging gradient system.

Embodiments disclosed herein have the advantage of shorter scan times when compared to traditional self-encoding methods. Embodiments further have the advantage of higher precisions using thicker slices when compared to traditional offset-slice methods. More specifically, embodiments disclosed herein do not require that the thickness of an excited slice be small compared to the maximal k-space encoded by the test waveform. Such advantages of the novel handling of gradient waveform errors described herein may result in improved image quality. In addition, embodiments disclosed herein may provide for a more overall efficient imaging process, given that the number of steps in amplitude may be engineered based on the desired characteristics.

Embodiments include a system with an MRI device and a computer. The computer includes a processor configured to facilitate the methods described herein. The computer may include an MR image processing system in communication with and/or at least partially on-board an MM Scanner of the MRI device, including at least one processor configured to carry out any of the methods described herein.

Embodiments of the computer may include a data processing system that includes a non-transitory computer readable storage medium having computer readable program code embodied in the medium. The computer-readable program code may include computer readable instructions configured to carry out any of the methods described herein. Embodiments disclosed herein may be performed in the background, with or without user intervention or any user knowledge. In some embodiments, the scan parameters (e.g., number of amplitudes, slices, reference scans, etc.) may be set according to an established scan mode based on the requirements desired of the MM system.

FIG. 1 illustrates a VP pulse sequence in accordance with embodiments disclosed herein. The VP pulse sequence includes a slice-selective excitation ($G_z$) followed by a variable amplitude prephasing (VP) encoding gradient, and then an acquisition concurrent with a test gradient waveform. The VP pulse sequence uses a novel variable amplitude prephasing encoding gradient (i.e., a VP gradient) in between the initial slice excitation gradient and test gradient waveform measurement. In FIG. 1, for illustrative purposes, the VP gradient is shown separate from the slice refocusing gradient; however, in practice, the two gradients may be combined to reduce the time between excitation and a readout. The slice direction is defined herein as the laboratory Z-direction, but one of ordinary skill in the art will appreciate that the direction could equally be along X- or Y-directions for measurements of X- or Y-direction gradients.

In accordance with embodiments, a complete measurement includes repetition of the sequence of FIG. 1 from each of a number of slices ($N_s$). The repetition involves using a number of VP gradient amplitudes ($N_v$) and a number of additional reference measurements ($N_0$). Those reference measurements are acquired with both the VP gradient and test gradient turned off.

Figure 2A:
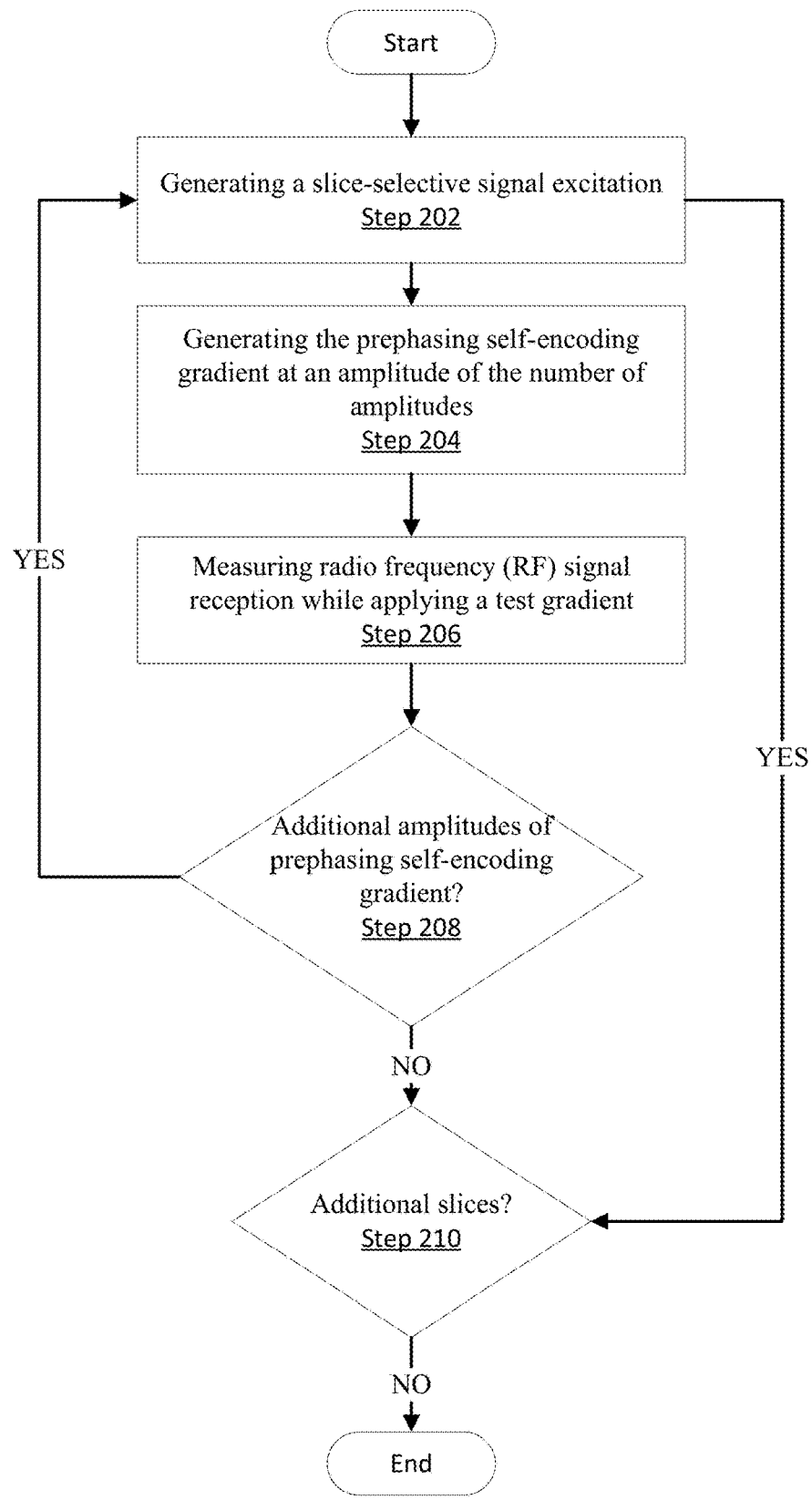
FIGS. 2A and 2B show flow charts in accordance with one or more embodiments disclosed herein.

FIG. 2A shows a flow chart of a method in accordance with one or more embodiments disclosed herein. The slice-selective signal excitation is generated in Step 202. Following the excitation, in Step 204, the prephasing self-encoding gradient is generated at one amplitude of the number of amplitudes to be measured. Following the prephasing self-encoding gradient, the RF signal is measured while applying a test gradient in Step 206. Steps 202-208 of FIG. 2A are repeated for each of the number of VP gradient amplitudes ($N_v$) and for each of the number of slices ($N_s$). That is exemplified by Step 208 that determines if there are additional gradient amplitudes to be evaluated. If there are additional gradient amplitudes to be evaluated (YES), the process repeats by returning to Step 202. If the number of VP gradient amplitudes has been reached (NO), the process proceeds to Step 210. Step 210 determines if there are additional slices to be evaluated. If there are additional slices to be evaluated (YES), the process returns to Step 202. If all of the slices have been evaluated (NO), the process ends. The measurements acquired during the methods of FIG. 2A may then be used towards forming or improving one or more images.

Figure 2B:
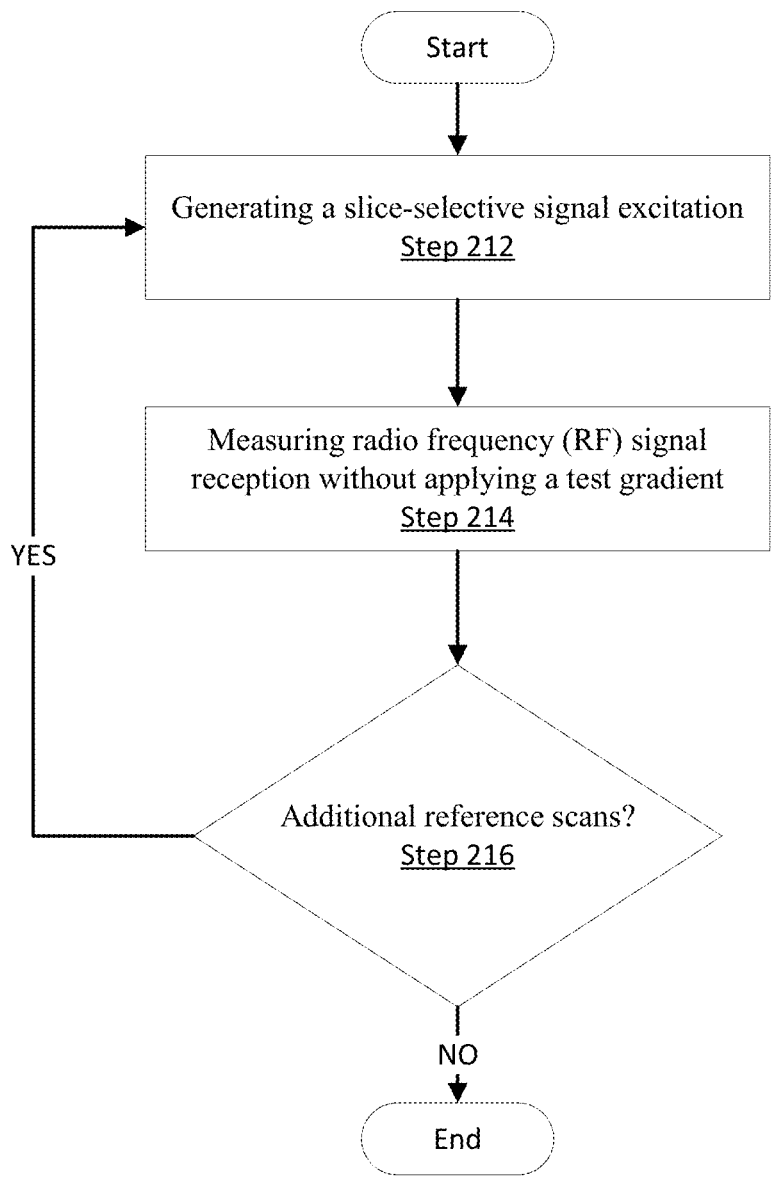

FIG. 2B shows a flow chart for evaluating reference signals in accordance with embodiments disclosed herein. FIG. 2B is similar to FIG. 2A, except the measurements are acquired with both the VP gradient and test gradient turned off. In Step 212, a slice-selective signal excitation is generated, similar to Step 202. In Step 214, the RF signal reception is measured without applying the test gradient. As explained below, the number of reference scans may be engineered based on the desired SNR. In Step 216, it is determined if additional reference measurements are needed. If additional measurements are desired (YES), the process returns to Step 212 and repeats. If the number of reference measurements (No) has been reached (NO), the process ends.

In accordance with embodiments disclosed herein, the measurements as a result of the methods of FIGS. 2A and 2B may then be used to calibrate the MRI system for improved image quality.

The following algebraic models are presented to facilitate an understanding of the gradient waveform using the novel VP gradients disclosed herein.

In accordance with embodiments, the acquired signal is given in Equation (1):

$$S_{n,m}(t) = \int M((z-z_m)/\delta) e^{-i\phi_{n,m}(t,z)} dz \qquad (1)$$

In Equation (1), M(z) is the excited slice profile centered at z=0 with unit thickness; zm is the slice-offset of the m-th slice; $\delta$ is the slice thickness; and n is the index to the variable pre-phasing step. If the slice profile is conjugate symmetric around zm, then the phase and magnitude of the signals are separable, resulting in $$\angle S_{n,m}(t) = \phi_{n,m}(t, z_m), \text{ and} \qquad (2)$$

$$|S_{n,m}(t)| = \left| \delta \int M(z) \cos(\delta k_{n,m}(t) z) dz \right|, \text{ where} \qquad (3)$$

$$k_{n,m}(t) = \frac{\gamma}{2\pi} \int_0^t G_{n,m}(t') dt'. \qquad (4)$$

In Equation (2), the observed signal phase, $\phi_{n,m}(t, z_m)$ contains all the contributions from the applied gradient (including induced gradients and $B_0$ eddy currents) plus static background field shifts.

From the acquisition of the $n^{th}$ VP gradient amplitude from the $m^{th}$ slice, the resonance frequency (in Hz) in the rotating frame may be estimated by 2-point central difference, $$f_{n,m}(t) = \frac{1}{2\pi} \frac{\phi_{n,m}(t+\Delta t, z_m) - \phi_{n,m}(t-\Delta t, z_m)}{2\Delta t}, \qquad (5)$$

where $\Delta t$ is the receiver sample period.

In accordance with embodiments disclosed herein, the effect of the VP gradient on f(t) may be neglected. That is further elucidated below with respect to FIG. 6. Because the effect of the VP gradient on f(t) is neglected, the frequency may be modeled as shown in Equation (6). That is, the frequency depends on the gradient (G) and spatially constant (B) field shifts due to the test gradient, plus a slice-dependent background term, $q_m$, which originates from background variations in $B_0$ or residual phases imparted by any other gradients in the sequence.

$$f_{n,m}(t) = \frac{\gamma}{2\pi}[z_m G(t) + B(t)] + q_m(t) \qquad (6)$$

In Equation (6), $z_m$ is the slice offset distance of the m-th slice. Defining $f_{0,m}$ as the average signal from the $N_0$ reference acquisitions from the mth slice, Equation 6 may be written for any point in time and all acquisitions as, $$f = Ab \qquad (7)$$

$$\begin{bmatrix} f_{1,1} \\ f_{2,1} \\ \vdots \\ f_{N_v,1} \\ f_{1,2} \\ \vdots \\ f_{N_v,2} \\ \vdots \\ f_{N_v,N_s} \\ f_{0,1} \\ f_{0,2} \\ \vdots \\ f_{0,N_s} \end{bmatrix} = \begin{bmatrix} z_1 & 1 & 1 & 0 & \cdots & 0 \\ z_1 & 1 & 1 & 0 & \cdots & 0 \\ \vdots & & & & & \\ z_1 & 1 & 1 & 0 & \cdots & 0 \\ z_2 & 1 & 0 & 1 & \cdots & 0 \\ \vdots & & & & & \\ z_2 & 1 & 0 & 1 & \cdots & 0 \\ \vdots & & & & & \\ z_{N_s} & 1 & 0 & 0 & \cdots & 1 \\ 0 & 0 & 0 & 0 & \cdots & 0 \\ 0 & 0 & 0 & 1 & \cdots & 0 \\ \vdots & & & & \ddots & \\ 0 & 0 & 0 & 0 & \cdots & 1 \end{bmatrix} \begin{bmatrix} G \\ B \\ q_1 \\ q_2 \\ \vdots \\ q_{N_s} \end{bmatrix}.$$

The rows in Equation (7) iterate first over the $N_v$ VP measurements, and then the $N_s$ slices. The reference measurements are appended as the last $N_s$ rows. The measured phase has a variance that depends on the signal magnitude, $|S_{n,m}|$, which is modulated by the VP gradient, $$\sigma^2_{\phi_{n,m}} \approx \frac{\sigma^2}{|S_{n,m}|^2}, \qquad (8)$$

where $\sigma^2$ is the variance of the measured complex signal from a single acquisition. Then the inverse covariance matrix of f, $\Sigma_f^{-1}$, is diagonal with the first $N_v \times N_s$ elements being proportional to and the final $N_s$ elements proportional to $N_0|S_{0,m}|^2$. The maximum likelihood solution to Equation (7) is given by weighted least squares, $$\hat{b} = (A^T \Sigma_f^{-1} A)^{-1} A^T \Sigma_f^{-1} f \qquad (9)$$

(the proportionality constant in $\Sigma_f^{-1}$ cancels). Thus, at any time, t, the measured test gradient waveform amplitude is $\hat{G} = \hat{b}(1)$, and the variance of $\hat{G}$ normalized to the number of acquisitions is $\sigma_G^2 = \Sigma_{\hat{b}}(1,1)$, where $$\Sigma_{\hat{b}} = \frac{1}{N_v + N_0} A^T \Sigma_f^{-1} A^{-1}. \qquad (10)$$

Figure 3:
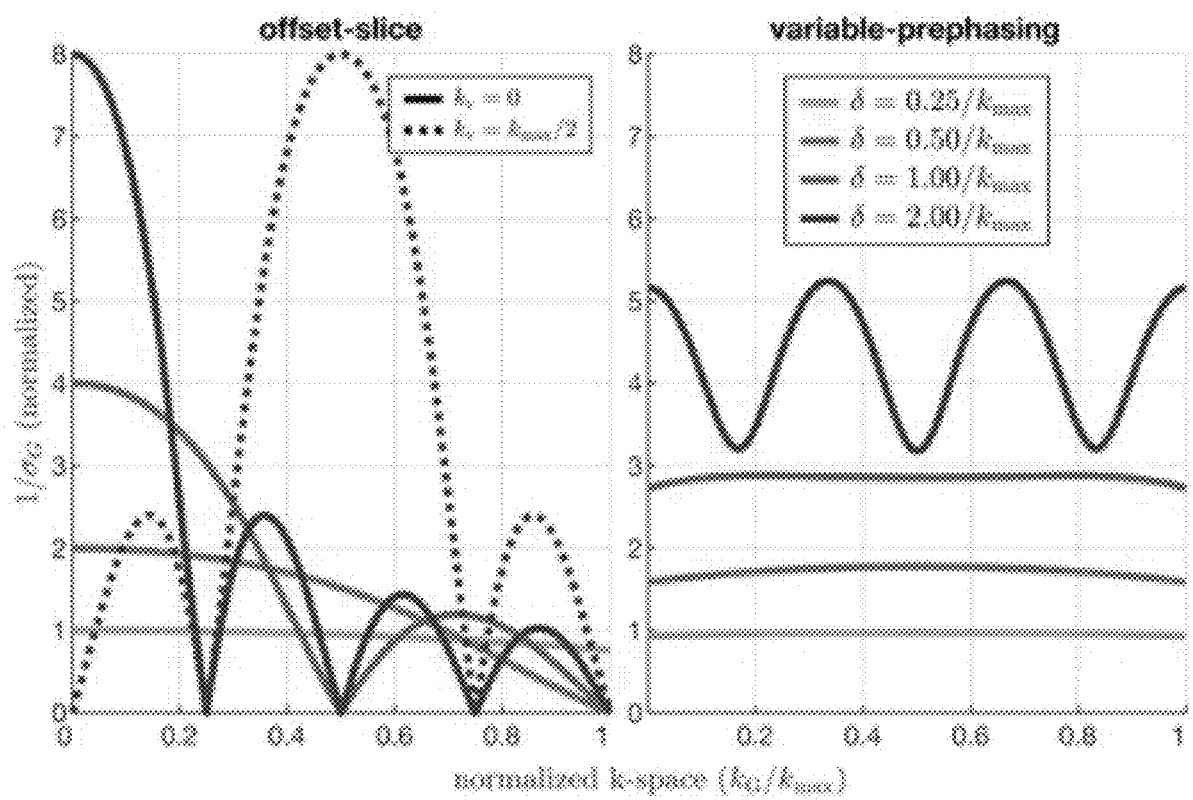
FIG. 3 shows a theoretical gradient waveform precision per excitation in accordance with one or more embodiments disclosed herein.

FIG. 3 shows a theoretical gradient waveform precision per excitation in accordance with one or more embodiments disclosed herein. FIG. 3 demonstrates a comparison of the theoretical precision of $\hat{G}(1/\sigma_G)$ using an offset-slice method (left) and VP methods (right) for a rectangular slice profile. Here, $$|S_n| = |\delta \sin c(\delta(k_G + k_{v,n}))|, \qquad (11)$$

where sin $c(x) = \sin(\pi x)/\pi x$, $\delta$ is the slice thickness, and $k_G$ and $k_{v,n}$ are k-space values encoded by the test and VP gradients, respectively. In FIG. 3, precision values are normalized relative to that with $k_G = 0$ and a thin slice, $\delta = 0.25/k_{max}$. That slice value was chosen to be thin enough, relative to the maximum k-space value, to provide nearly uniform precision over the entire domain of $k_G$.

The left side of FIG. 3 shows the precision for an offset-slice method with $k_{max}\delta=0.25$, 0.5, 1.0, and 2.0. The thin slice shown ($\delta_z=0.25/k_{max}$) provides low but consistent precision over k-space domain encoded by the test gradient. The thickest slice provides the highest precision near $k_G=0$, but reduced precision and even zero precision at various points in the k-space domain. In the offset-slice gradient waveform methods, precision is limited by the maximum area of the test gradient waveform. Thin slices may be used to produce low but uniform precision, while precision in larger slices may vary widely.

In accordance with embodiments disclosed herein, the VP method counters the consequences of a thick slice by shifting the signal magnitude, and hence the precision function, across the k-space domain with each VP step. That is illustrated by the dashed line on the left side of FIG. 3, which shows the precision from the thick slice acquisition shifted when $k_v=-k_{max}/2$.

The right side of FIG. 3 shows the net precision of the VP method for $N_0=N_v=4$ and $k_v$ values uniformly spaced between $k_{min}$ and $k_{max}$. The right side of FIG. 3 demonstrates that, across the entire k-space domain, the precision increases with slice thickness in accordance with embodiments disclosed herein. Accordingly, the precision of the gradient waveform measurement may be improved over the whole domain of $k_G$ by combining multiple measurements over a range of VP gradient areas.

Because the precision of the measurement varies across the k-space domain, an average measure of the variance over the domain of $k_G$ can be used to optimize the slice thickness of a given measurement based on Equation (12):

$$\langle \sigma_G^2 \rangle \equiv \frac{1}{\Delta k}\int_{k_{min}}^{k_{max}} \sigma_G^2 dk_G. \tag{12}$$

Figure 4:
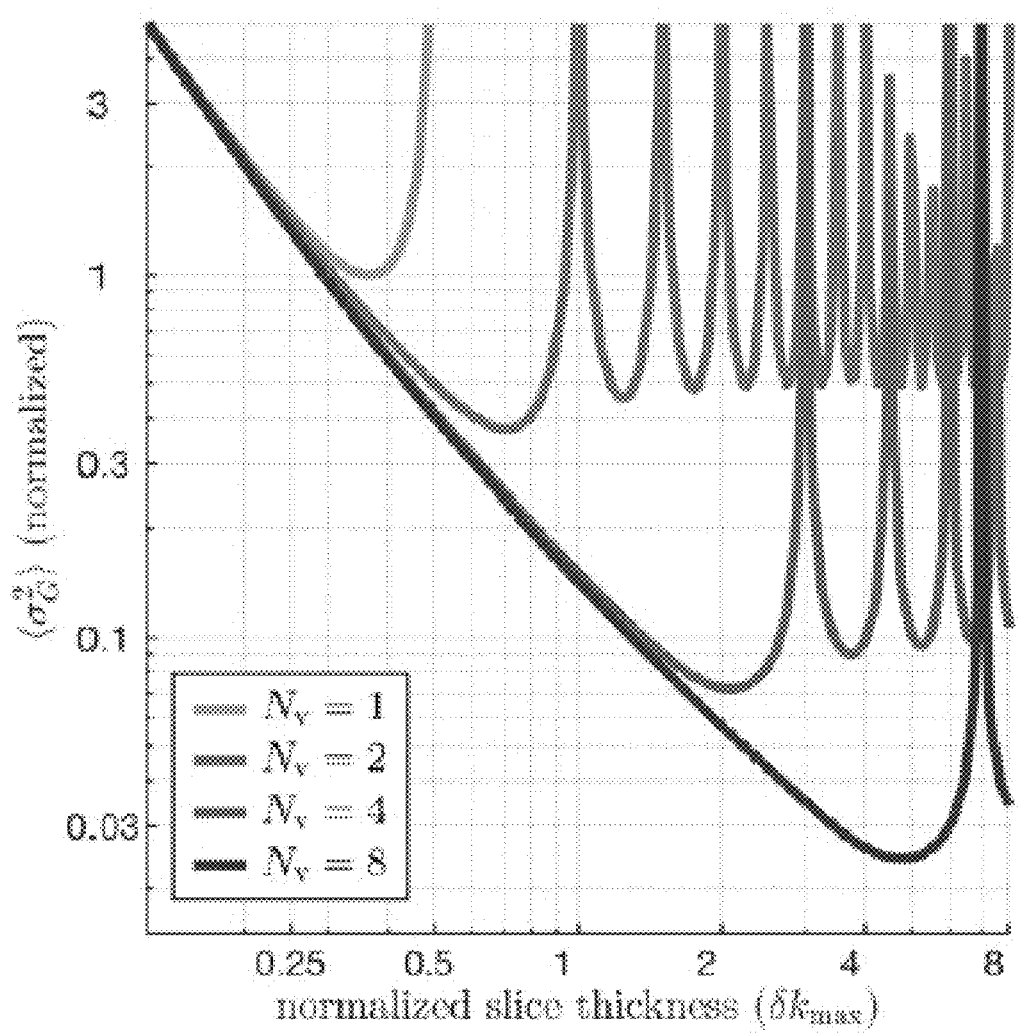
FIG. 4 illustrates an average measure of the variance over the domain of $k_G$ in accordance with one or more embodiments disclosed herein.

FIG. 4 illustrates an average measure of the variance over the domain of $k_G$ in accordance with one or more embodiments disclosed herein. That is, FIG. 4 graphs $\langle \sigma_G^2 \rangle$ as a function of slice thickness ($\delta k_{max}$) for $N_v=1, 2, 4$, and 8 and $k_{min}=0$. For each curve, the set of $N_v$ values of $k_v$ are linearly spaced between 0 and $-k_{max}$, and $\langle \sigma_G^2 \rangle$ is normalized relative to lowest $\langle \sigma_G^2 \rangle$ with $N_v=1$. For all the curves of FIG. 4, $N_0=N_v$. The lowest $\langle \sigma_G^2 \rangle$ with $N_v=1$ shown in FIG. 4 could be considered analogous to a minimum noise variance in an offset-slice method.

In FIG. 4, the variance $\langle \sigma_G^2 \rangle$ decreases with increasing slice thickness to a point where the phase wrapping causes a loss of signal and $\langle \sigma_G^2 \rangle$ increases. Increasing the number of amplitudes $N_v$ allows for thicker slices and, in-turn, a lower variance of the gradient waveform measurement per excitation. Thus, by increasing the number of amplitudes of VP steps $N_v$, thicker slices may reduce the average variance of the gradient waveform measurement. For large $N_v$, the variance $\langle \sigma_G^2 \rangle$ is minimized at approximately $\delta k_{max} N_v/2$.

Figure 5:
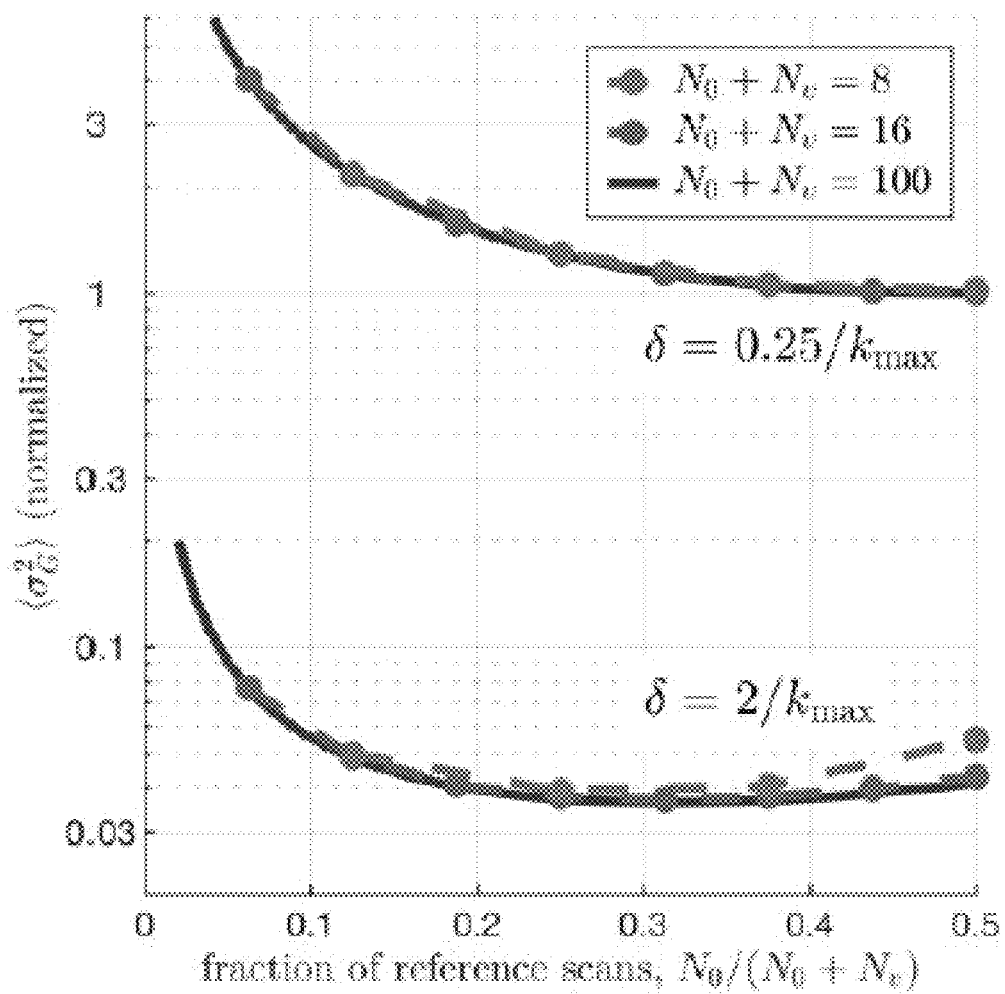
FIG. 5 illustrates the variance for a fixed number of acquisitions for a thin slice and a thick slice in accordance with one or more embodiments disclosed herein.

FIG. 5 illustrates the variance for a fixed number of acquisitions for a thin slice (top set of curves) and a thick slice (bottom set of curves). FIG. 5 shows the trade-off between the number of reference scans $N_0$ versus the number of amplitudes $N_v$ within a fixed total number of acquisitions $N_0+N_v$. For the thin slice ($\delta_z=0.25/k_{max}$), the variance is optimized when $N_v=N_0$. For the thick slice ($\delta_z=2/k_{max}$), the variance is optimized when the number of reference scans $N_0$ uses approximately 30% of the total scan duration.

However, as can be seen in FIG. 5, the degradation of the variance with $N_0$ being 30% to 50% of the total scan time is small compared to the improvement in the precision provided by the larger slice thickness in accordance with embodiments disclosed herein.

Recall, the effect of the VP gradient on the resonance frequency f(t) was neglected in Equation (6). If the residual contributions from the VP gradient lasting into acquisition cannot be neglected, Equation (6) becomes:

$$f_{n,m}(t) = \frac{\gamma}{2\pi}[z_m G(t) + B(t) + z_m G_{v,n}(t) + B_{v,n}(t)] + q_m(t) \tag{13}$$

where $G_{v,n}$ and $B_{v,n}$ are the linear and 0-th order contributions of the n-th VP gradient lasting into the acquired signal. That will result in a biased gradient measurement, but it is straightforward to estimate the magnitude of this bias. In the approximation that the gradient system can be treated as linear time-invariant, a change in the amplitude of the VP gradient ($g_n$) creates a proportional change in $G_{v,n}$ and $B_{v,n}$. Accordingly, $G_{v,n}$ and $B_{v,n}$ may be approximated by $G_{v,n}(t) \approx c(t)g_n$, and $B_{v,n}(t) \approx d(t)g_n$, where c and d are the magnitude of the residual eddy current.

Incorporating this model into the linear system of equations, $$f = Ab + Uv \text{ where} \tag{14}$$

$$U = \begin{bmatrix} g_1 z_1 & g_1 \\ \vdots & \vdots \\ g_{N_v} z_1 & g_{N_v} \\ g_2 z_2 & g_1 \\ \vdots & \vdots \\ g_{N_v} z_2 & g_{N_v} \\ 0 & 0 \\ \vdots & \vdots \\ 0 & 0 \end{bmatrix} \text{ and} \tag{15}$$

$$v = \begin{bmatrix} c(t) \\ d(t) \end{bmatrix} \tag{16}$$

The expected bias can be calculated by substituting Equation (14) into Equation (9):

$$\langle \hat{b} \rangle = (A^T \Sigma_f^{-1} A)^{-1} A^T \Sigma_f^{-1}(Ab+Uv) = b + (A^T \Sigma_f^{-1} A)^{-1} A^T \Sigma_f^{-1} Uv \tag{17}$$

where the second term is the expected bias of $\hat{b}$. Therefore, given some estimate of the residual long-lived eddy currents, the expected bias in the estimated gradient waveform can be estimated from the magnitude of the residual eddy current (c).

Such residual long-lived eddy currents are typically low amplitude, can be easily measured using traditional methods (including offset-slice measurements). Therefore, those eddy currents are typically compensated with pre-emphasis. However, the potential bias may also be reduced (or effectively eliminated) by increasing the delay between the VP gradient and the start of acquisition, potentially at the cost of a small amount of precision due to $T_2^*$ decay.

To illustrate, consider a model of eddy currents as exponential decays. In addition to the magnitude and time constant of the eddy currents, the bias will depend on the duration of VP gradient ($\tau_v$) and the delay between the VP gradient and the start of acquisition ($\tau_d$). Residual eddy currents at the start of acquisition may be estimated as the difference between eddy currents induced from the rising and falling edges of the rectangular VP gradient, $$c(\tau_d) = \kappa(e^{\tau_d/\tau_c} - e^{-(\tau_d + \tau_v)/\tau_c}) \quad (18)$$

where $\kappa$ is the magnitude of the eddy current and $\tau_c$ is the characteristic time-constant of the eddy current.

Figure 6:
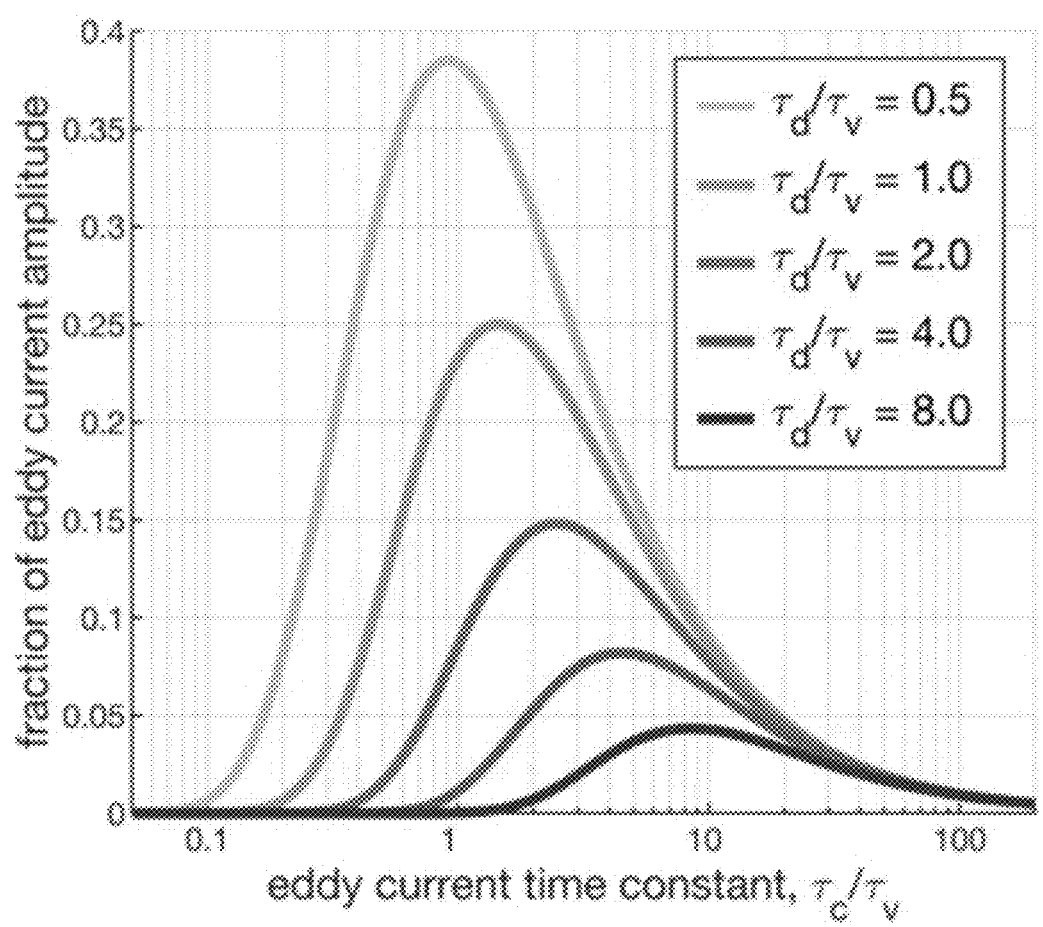
FIG. 6 shows a fraction of the residual eddy current that lasts into acquisition as a function of the eddy current time constant in accordance with embodiments disclosed herein.

FIG. 6 shows a fraction of the residual eddy current that lasts into acquisition ($c/\kappa$) as a function of the eddy current time constant ($\tau_d/\tau_v$) in accordance with embodiments disclosed herein. FIG. 6 shows the fraction of the residual eddy current that lasts into acquisition for $\tau_d/\tau_c = 0.5$, 1.0, 2.0, 4.0 and 8.0. For example, in the case of $\tau_d/\tau_c = 4.0$, FIG. 6 demonstrates that the residual eddy current that lasts into acquisition is less than 10% of the nominal eddy current amplitude. In view of FIG. 6, Equation (17) provides a straightforward formula to estimate potential measurement bias caused by residual eddy currents from the VP gradient.

Furthermore, if eddy currents off the VP gradient are not negligible, increasing the delay ($\tau_d$) between the VP gradient (with duration $\tau_v$) and the acquisition can be used to reduce the bias of the measured gradient waveform.

Figure 7:
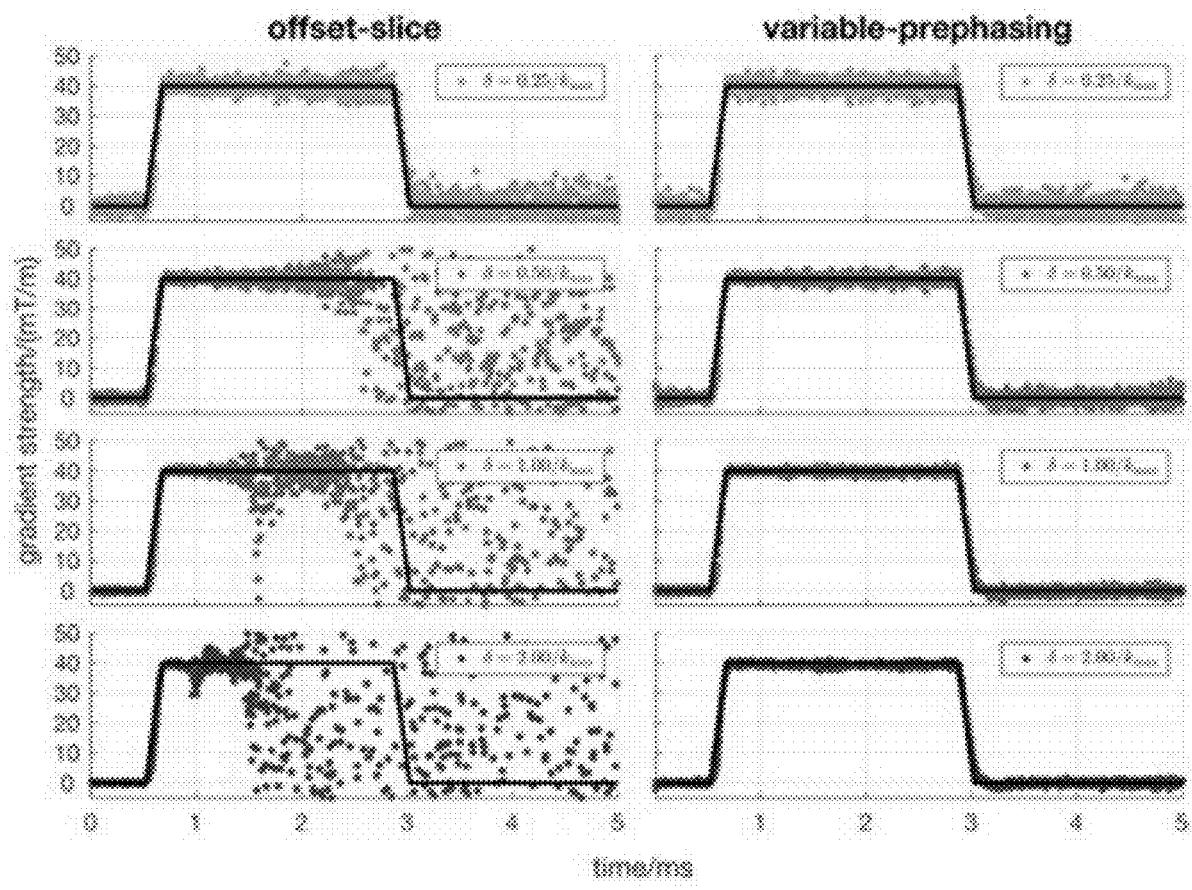
FIG. 7 demonstrates a VP gradient waveform measurement using a trapezoidal gradient waveform in accordance with one or more embodiments disclosed herein.
Figure 8:
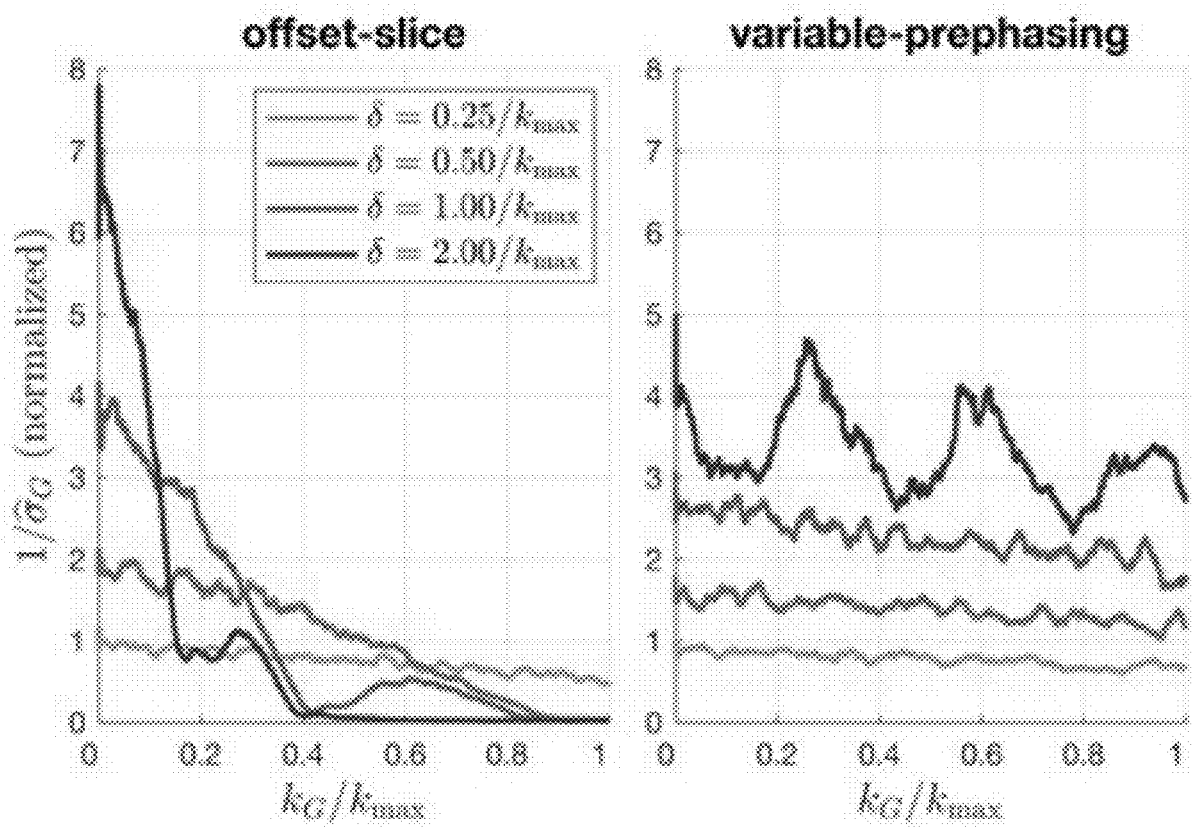
FIG. 8 demonstrates the precision of measurements associated with the waveforms shown in FIG. 7 in accordance with embodiments disclosed herein.

FIGS. 7-8 demonstrate VP gradient waveform measurements compared to an offset-slice method in accordance with embodiments disclosed herein. In order to compare the different methods of measuring gradient waveforms, test waveforms are needed that highlight regions of noise in the measurement. As illustrated in FIG. 3, the precision in gradient waveform measurements is primarily a function of encoded k-space. Chirp or triangular gradient waveforms have been used to characterize gradient system frequency response because those waveforms can be designed to sample over a range of specific frequencies. However, triangle waveforms may not be ideal because the series of triangles used to evaluate the system response vary in gradient area. Also, a chirp waveform will traverse the same domain of k-space multiple times. Although triangle and chirp waveforms may be used, a trapezoidal test waveform is used herein to quantitatively compare gradient waveform measurement methods because trapezoidal waveforms quickly encode a specific domain in k-space.

Herein, gradient waveform measurements were performed on a Bruker 7T scanner, with a 38 mm birdcage coil used for RF excitation and reception. The gradient waveform measurements were performed in a 15 mL tube of distilled water doped with $CuSO_4$ to a $T_1$ and $T_2 \approx 300$ ms. The gradient waveform measurements were performed on the trapezoidal test gradient waveform in the Z-direction, with an amplitude of 40 mT/m, and duration of 2.35 ms, providing $k_{max} \approx 2$ mm$^{-1}$. The readout bandwidth was 250 kHz. A total of seven slices were acquired, at $-6$, $-4$, $-2$, 0, 2, 4, and 6 mm, interspaced within repetition times of 250 ms. Both offset-slice and VP gradient waveform measurements (with $N_v = N_0 = 4$) had the same scan time, and included $\delta_z = 0.125$, 0.25, 0.5 and 1.0 mm. Gradient waveforms were estimated from the measurements using Equation (9). The measurements were repeated 16 times, and the standard deviation of the waveform measurement ($\hat{\sigma}_G$) was calculated at each point in the waveform.

FIG. 7 demonstrates a VP gradient waveform measurement using a trapezoidal gradient waveform in accordance with one or more embodiments disclosed herein. FIG. 7 shows a comparison of an offset-slice based gradient waveform measurements (left) with VP measurements (right) in accordance with embodiments disclosed herein. In FIG. 7, the number of reference scans ($N_0$) is equal to the number of amplitudes ($N_v$) and set to four. FIG. 7 demonstrates different slice thicknesses for, from the top to the bottom of FIG. 7, a $k_{max}\delta_z = 0.25$, 0.5, 1.0, and 2.0, respectively.

Referring to the top of FIG. 7, for the thin slice ($k_{max}\delta_z = 0.25$), the offset-slice method (left) and VP method measurements (right) provide similar noise variance throughout the trapezoidal gradient. As the slice thickness is increased, the offset-slice method (left) shows some improvement in the gradient waveform precision at the beginning of the gradient waveform; however, the variance increases significantly as the gradient area increases. In contrast, in the VP method (right), an increase in slice thickness shows improved precision of the gradient waveform throughout the entire gradient waveform. FIG. 7 clearly demonstrates advantages of the VP embodiments disclosed herein when compared to an offset-slice method.

FIG. 8 demonstrates the precision of measurements associated with the waveforms shown in FIG. 7 in accordance with embodiments disclosed herein. The precision of those measurements, ($1/\hat{\sigma}_{G_w}$), shown in FIG. 8 is estimated from 16 repetitions of the gradient waveform shown in FIG. 7. The precision was normalized to the thin slice case ($\delta_z = 0.25/k_{max}$) at $k_G = 0$. For the offset-slice method (left), the thinnest slice ($\delta_z = 0.25/k_{max}$) provides a low, but consistent, precision over the entire range of $k_G/k_{max}$. As can be seen, increasing the slice thickness improves the precision at low $k_G$, but reduces the precision at high $k_G$.

As can be seen in the right side of FIG. 8, embodiments of the VP gradient measurements provide an improved precision that is more uniform over the entire range of $k_G/k_{max}$. Further, those measurements closely match the theoretical predictions shown in FIG. 3. The slight decay with increasing $k_G$ apparent in the measured precision of FIG. 8 (as compared to the theoretical shown in FIG. 3) is due to $T_2^*$ relaxation. Other differences between FIG. 8 and FIG. 3, particularly with respect to the thick slices in the offset-slice method, are due to a non-rectangular excited slice profile.

The examples demonstrated above show, that with an 8-fold increase in slice thickness, a greater than 5-fold increase in SNR can be achieved. One of ordinary skill in art will appreciate that larger increases in SNR are possible with the embodiments disclosed herein.

Regarding residual eddy currents associated with the VP gradient, using Equation (17) and the gradient waveform measurements presented herein, Table 1 compares the average variance of the measured noise $\hat{\sigma}_G$ with a worst-case bias caused by a 5% amplitude eddy current off a VP gradient with max amplitude 40 mT/m and $\tau_d/\tau_v = 4.0$.

TABLE 1

| δ | 0.25/$k_{max}$ | 0.6/$k_{max}$ | 10/$k_{max}$ | 20/$k_{max}$ |
|---|---|---|---|---|
| $\hat{\sigma}_G$ (mT/m) | 2.93 | 1.74 | 1.08 | 0.73 |
| maximum bias (mT/m) | 0.11 | 0.15 | 0.16 | 0.16 |

As can be seen from the values in Table 1, for this range of measurements, the worst-case bias is less than the average variances measured.

Embodiments of the VP gradient method disclosed herein can improve the SNR efficiency of gradient waveform measurements by overcoming the slice thickness limitations associated with offset-slice methods. Embodiments disclosed herein may be applied to any MM system, and embodiments do not require additional hardware. By using an intermediate value for the number of VP amplitudes ($N_v$), embodiments disclosed herein can trade off the desired precision of the measurement with the total acquisition time.

While the VP methods disclosed herein are shown to improve the precision of gradient waveform measurements by increasing the range in useable slice thickness, there are conditions in which larger slices may reduce the accuracy. For example, the accuracy of embodiments disclosed herein depends upon conjugate symmetry of the slice profile. Large slices may be less symmetric, either due to partial volume averaging, the presence of background gradients, or air tissue/interfaces. In such cases, large slices may increase bias in the measurements.

In accordance with embodiments disclosed herein, the precision of the gradient waveform measurement may be further improved by combining measurements acquired at two or more different slice thicknesses. Further, alternate choices of the N VP gradient areas may further improve precision. For some applications, precision may be more important in some regions of k-space than other regions, so the density of VP measurements may be increased in those regions.

Further, while a single channel quadrature coil was used for signal reception herein, the model in Equation (7) may be extended to optimally estimate gradient waveforms from acquisitions using multi-channel receive coils available on many commercial MM systems.

Because embodiments disclosed herein allow gradient waveform measurements over a larger range in gradient areas, it will enable measurement and correction of gradient waveforms at or near the nonlinear limits of the gradient system. Other methods have used a linear time-invariant system model of the gradient system (e.g., the Gradient Impulse Response Function, or GIRF). However, the gradient system is only approximately linear over a certain range of gradient amplitude, slew rate, and acceleration rate. Because imaging methods use waveforms that approach the non-linear limits of the gradient system, the fidelity of the GIRF will degrade. As such, either such waveforms will need to be individually measured and calibrated, or nonlinear methods to analyze the gradient system are required.

The method steps in any of the embodiments described herein are not restricted to being performed in any particular order. Also, structures or systems mentioned in any of the method embodiments may utilize structures or systems mentioned in any of the device/system embodiments. Such structures or systems may be described in detail with respect to the device/system embodiments only but are applicable to any of the method embodiments.

Features in any of the embodiments described in this disclosure may be employed in combination with features in other embodiments described herein, such combinations are considered to be within the spirit and scope of the present invention.

The contemplated modifications and variations specifically mentioned in this disclosure are considered to be within the spirit and scope of the present invention.

More generally, even though the present disclosure and exemplary embodiments are described above with reference to the examples according to the accompanying drawings, it is to be understood that they are not restricted thereto. Rather, it is apparent to those skilled in the art that the disclosed embodiments can be modified in many ways without departing from the scope of the disclosure herein. Moreover, the terms and descriptions used herein are set forth by way of illustration only and are not meant as limitations. Those skilled in the art will recognize that many variations are possible within the spirit and scope of the disclosure as defined in the following claims, and their equivalents, in which all terms are to be understood in their broadest possible sense unless otherwise indicated.

What is claimed is:

1. A method for measuring gradient waveforms in a Magnetic Resonance Imaging (MRI) device, the method comprising:
   for a first slice of a number of slices, and for a number of amplitudes of a prephasing self-encoding gradient:
      generating a slice-selective signal excitation;
      following the slice-selective signal excitation, generating the prephasing self-encoding gradient at an amplitude of the number of amplitudes, wherein the prephasing self-encoding gradient is based on a change in phase from the slice-selective signal excitation; and
      after generating the prephasing self-encoding gradient, measuring radio frequency (RF) signal reception while applying a test gradient.

2. The method of claim 1, further comprising:
   for the first slice, measuring the RF signal reception for other amplitudes of the number of amplitudes.

3. The method of claim 2, further comprising:
   measuring RF signal reception for other slices of the number of slices, wherein the RF signal reception for each slice comprises the RF signal reception for the number of amplitudes.

4. The method of claim 1, wherein the slice-selective signal excitation for a second slice of the number of slices occurs concurrently with measuring radio frequency signal reception while applying a test gradient for a first slice of the number of slices.

5. The method of claim 1, further comprising:
   for a number of reference signals:
      measuring RF signal reception without generating the prephasing self-encoding gradient and applying the test gradient.

6. The method of claim 5, further comprising:
   encoding an MR image using the number of reference signals and the measured RF signal.

7. A system for measuring gradient waveforms, the system comprising:
   a Magnetic Resonance Imaging (MRI) device;
   a computer comprising a processor, the processor configured to cause the MRI device to perform a method, the method comprising:
      for a first slice of a number of slices, and for a number of amplitudes of a prephasing self-encoding gradient:
         generating a slice-selective signal excitation;
         following the slice-selective signal excitation, generating the prephasing self-encoding gradient at a first amplitude of the number of amplitudes, wherein the prephasing self-encoding gradient is based on a change in phase from the slice-selective signal excitation; and
         after generating the prephasing self-encoding gradient, measuring radio frequency (RF) signal reception while applying a test gradient.

8. The system of claim 7, wherein the method further comprises:
   for the first slice, measuring the RF signal reception for other amplitudes of the number of amplitudes.

9. The system of claim 8, wherein the method further comprises:

measuring RF signal reception for other slices of the number of slices, wherein the RF signal reception for each slice comprises the RF signal reception for the number of amplitudes.

10. The system of claim 7, wherein the slice-selective signal excitation for a second slice of the number of slices occurs concurrently with measuring radio frequency signal reception while applying a test gradient for a first slice of the number of slices.

11. The system of claim 7, wherein the method further comprises:
for a number of reference signals:
measuring RF signal reception without generating the prephasing self-encoding gradient and applying the test gradient.

12. The system of claim 11, wherein the method further comprises:
encoding gradient waveform using the number of reference signals and the measured RF signal.

13. A non-transitory computer readable medium comprising computer readable program code, which when executed by a computer processor enables a Magnetic Resonance Imaging (MRI) device to perform a method for measuring gradient waveforms, the method comprising:
for a first slice of a number of slices, and for a number of amplitudes of a prephasing self-encoding gradient:
generating a slice-selective signal excitation;
following the slice-selective signal excitation, generating the prephasing self-encoding gradient at a first amplitude of the number of amplitudes, wherein the prephasing self-encoding gradient is based on a change in phase from the slice-selective signal excitation; and
after generating the prephasing self-encoding gradient, measuring radio frequency (RF) signal reception while applying a test gradient.

14. The non-transitory computer readable medium of claim 13, the method further comprising:
for the first slice, measuring the RF signal reception for other amplitudes of the number of amplitudes.

15. The non-transitory computer readable medium of claim 14, the method further comprising:
measuring RF signal reception for other slices of the number of slices, wherein the RF signal reception for each slice comprises the RF signal reception for the number of amplitudes.

16. The non-transitory computer readable medium of claim 13, wherein the slice-selective signal excitation for a second slice of the number of slices occurs concurrently with measuring radio frequency signal reception while applying a test gradient for a first slice of the number of slices.

17. The non-transitory computer readable medium of claim 13, the method further comprising:
for a number of reference signals:
measuring RF signal reception without generating the prephasing self-encoding gradient and applying the test gradient.

18. The non-transitory computer readable medium of claim 17, the method further comprising:
encoding an MR image using the number of reference signals and the measured RF signal.

* * * * *